United States Patent
Koike et al.

(10) Patent No.: US 6,830,948 B2
(45) Date of Patent: Dec. 14, 2004

(54) METHOD FOR PRODUCING GROUP III NITRIDE COMPOUND SEMICONDUCTOR AND GROUP III NITRIDE COMPOUND SEMICONDUCTOR DEVICE

(75) Inventors: Masayoshi Koike, Aichi (JP); Akira Kojima, Aichi (JP); Toshio Hiramatsu, Aichi (JP); Yuta Tezen, Aichi (JP)

(73) Assignee: Toyoda Gosei Co., Ltd., Aichi-ken (JP)

( * ) Notice: Subject to any disclaimer, the term of this patent is extended or adjusted under 35 U.S.C. 154(b) by 6 days.

(21) Appl. No.: 10/168,629

(22) PCT Filed: Dec. 21, 2000

(86) PCT No.: PCT/JP00/09121

§ 371 (c)(1),
(2), (4) Date: Sep. 26, 2002

(87) PCT Pub. No.: WO01/48799

PCT Pub. Date: Jul. 5, 2001

(65) Prior Publication Data

US 2003/0092230 A1 May 15, 2003

(30) Foreign Application Priority Data

Dec. 24, 1999 (JP) .......................................... 11-367613

(51) Int. Cl.$^7$ ............................................. H01L 21/06
(52) U.S. Cl. .......................................... 438/46; 257/103
(58) Field of Search ................................ 438/439, 429, 438/46, 518, 767; 257/103

(56) References Cited

U.S. PATENT DOCUMENTS

| 5,185,290 A | 2/1993 | Aoyagi et al. |
| 5,798,536 A | 8/1998 | Tsutsui |
| 6,051,849 A | 4/2000 | Davis et al. |
| 6,110,277 A | 8/2000 | Braun |
| 6,121,121 A | 9/2000 | Koide |

(List continued on next page.)

FOREIGN PATENT DOCUMENTS

| EP | 0 551 721 A2 | 7/1993 |
| EP | 0 799 666 A3 | 6/1997 |
| EP | 0 951 055 A2 | 10/1999 |
| EP | 0 993 048 A2 | 4/2000 |
| EP | 1 045 431 A1 | 10/2000 |
| EP | 1 059 661 A2 | 12/2000 |
| EP | 1 059 677 A2 | 12/2000 |

(List continued on next page.)

OTHER PUBLICATIONS

Wolf et al., "Silicon Processing for the VLSI Era," vol. 1, p. 5, Lattice Press, 1986.
Ujiie et al., "Epitaxial Lateral Overgrowth of GaAs on a Si Substrate", Japanese Journal of Applied Physics vol. 28, No. 3, Mar., 1989, pp. L337–L339.
Partial Translation of the Office Action for Japanese Patent Application No. 9–311518 dated Jun. 10, 2003.

(List continued on next page.)

Primary Examiner—David Nelms
Assistant Examiner—Quoc Hoang
(74) Attorney, Agent, or Firm—McGinn & Gibb, PLLC

(57) ABSTRACT

By using a mask 4, a first Group III nitride compound semiconductor layer 31 is etched, to thereby form an island-like structure such as a dot-like, striped-shaped, or grid-like structure, so as to provide a trench/post. Thus, without removing the mask 4 formed on a top surface of the upper layer of the post, a second Group III nitride compound layer 32 can be epitaxially grown, vertically and laterally, with a sidewall/sidewalls of the trench serving as a nucleus, to thereby bury the trench and also grow the layer in the vertical direction. The second Group III nitride compound layer 32 does not grow epitaxially on the mask 4. In this case, propagation of threading dislocations contained in the first Group III nitride compound semiconductor layer 31 can be prevented in the upper portion of the second Group III nitride compound semiconductor 32 that is formed through lateral epitaxial growth and a region having less threading dislocations can be formed in the buried portion of the trench.

13 Claims, 11 Drawing Sheets

U.S. PATENT DOCUMENTS

| | | | |
|---|---|---|---|
| 6,146,457 A | 11/2000 | Solomon | |
| 6,153,010 A | 11/2000 | Kiyoku et al. | |
| 6,274,518 B1 | 8/2001 | Yuri et al. | |
| 6,319,742 B1 | 11/2001 | Hayashi et al. | |
| 6,329,667 B1 | 12/2001 | Ota et al. | |
| 6,355,497 B1 | 3/2002 | Romano et al. | |
| 6,365,921 B1 | 4/2002 | Watanabe et al. | |
| 6,380,108 B1 * | 4/2002 | Linthicum et al. | 438/791 |
| 6,500,257 B1 * | 12/2002 | Wang et al. | 117/95 |

FOREIGN PATENT DOCUMENTS

| | | |
|---|---|---|
| JP | 49-149679 | 4/1973 |
| JP | 48-95181 | 12/1973 |
| JP | 51-137393 | 11/1976 |
| JP | 55-34646 | 8/1978 |
| JP | 57-115849 | 7/1982 |
| JP | 58-33882 | 2/1983 |
| JP | 1-316459 | 12/1989 |
| JP | 3-133182 | 6/1991 |
| JP | 4-10665 | 1/1992 |
| JP | 4-84418 | 3/1992 |
| JP | 4-303920 | 10/1992 |
| JP | 5-41536 | 2/1993 |
| JP | 5-110206 | 4/1993 |
| JP | 5-283744 | 10/1993 |
| JP | 5-343741 | 12/1993 |
| JP | 6-196757 | 7/1994 |
| JP | 07-249830 | 9/1995 |
| JP | 7-273367 | 10/1995 |
| JP | 8-64791 | 3/1996 |
| JP | 8-102549 | 4/1996 |
| JP | 8-116090 | 5/1996 |
| JP | 8-222812 | 8/1996 |
| JP | 8-274411 | 10/1996 |
| JP | 9-162125 | 6/1997 |
| JP | 10-312971 | 11/1998 |
| JP | 10-321954 | 12/1998 |
| JP | 11-031864 | 2/1999 |
| JP | 11-043398 | 2/1999 |
| JP | 11-135770 | 5/1999 |
| JP | 11-135832 | 5/1999 |
| JP | 11-145516 | 5/1999 |
| JP | 11-145519 | 5/1999 |
| JP | 11-191533 | 7/1999 |
| JP | 11-191657 | 7/1999 |
| JP | 11-191659 | 7/1999 |
| JP | 11-219910 | 8/1999 |
| JP | 11-251632 | 9/1999 |
| JP | 11-260737 | 9/1999 |
| JP | 11-274082 | 10/1999 |
| JP | 11-312825 | 11/1999 |
| JP | 11-329971 | 11/1999 |
| JP | 11-330546 | 11/1999 |
| JP | 11-340508 | 12/1999 |
| JP | 2000-021789 | 1/2000 |
| JP | 2000-44121 | 2/2000 |
| JP | 2000-91253 | 3/2000 |
| JP | 2000-106455 | 4/2000 |
| JP | 2000-106473 | 4/2000 |
| JP | 2000-124500 | 4/2000 |
| JP | 2000-150959 | 5/2000 |
| JP | 2000-174393 | 6/2000 |
| JP | 2000-232239 | 8/2000 |
| JP | 2000-244061 | 9/2000 |
| JP | 2000-261106 | 9/2000 |
| JP | 2000-277437 | 10/2000 |
| JP | 2000-299497 | 10/2000 |
| JP | 2000-357663 | 12/2000 |
| JP | 2000-357843 | 12/2000 |
| JP | 2001-60719 | 3/2001 |
| JP | 2001-93837 | 4/2001 |
| JP | 2001-111174 | 4/2001 |
| JP | 2001-122693 | 5/2001 |
| JP | 2001-176813 | 6/2001 |
| JP | 2001-257193 | 9/2001 |
| WO | WO 97/11518 | 3/1997 |
| WO | WO 98/47170 | 10/1998 |
| WO | WO 99/01594 | 1/1999 |
| WO | WO 00/04615 | 1/2000 |
| WO | WO 00/55893 | 9/2000 |
| WO | WO 02/058120 A1 | 7/2002 |

OTHER PUBLICATIONS

D. Kapolnek et al., "Anisotropic epitaxial lateral growth in GaN selective area epitaxy", Appl. Phys. Lett. 71(9), Sep. 1, 1997, pp. 1204–1206.

Matsushima et al., "Selective growth of GaN on sub–micron pattern by MOVPE", Technical Report of IEICE, ED97–32, CPM97–20 (May 1997) pp. 41–46.

Dimitriadis et al., "Contacts of titanium nitride to—and p–type gallium nitride films", Solid–State Electronics 43 (1999), pp. 1969–1972.

Zheleva et al., "Pendeo–Epitaxy—A New Approach for Lateral Growth of Gallium Nitride Structures", MRS Internet J. Nitride Semicond. Res. 4SI, G3.38 (1999), 6 pages total.

Zheleva et al., "Pendeo–Epitaxy: A New Approach for Lateral Growth of Gallium Nitride Films", Journal of Electronic Materials, vol. 28, No. 4, 1999, pp. L5–L8.

PCT Form 210 (PCT/JP02/05446).

PCT Form 210 (PCT/JP02/02628).

PCT Form 210 (PCT/JP02/01159).

PCT Form 210 (PCT/JP01/01928).

PCT Form 210 (PCt/JP01/02695).

PCT Form 210 (PCT/JP00/09120).

PCT Form 210 (PCT/JP01/01396).

PCT Form 210 (PCT/JP01/01178).

PCT Form 210 (PCT/JP01/01663).

PCT Form 210 (PCT/JP00/09121).

PCT Form 210 (PCT/JP00/09220).

PCT Forms 338 and 409 (IPER) (PCT/JP01/02695) and translations thereof.

PCT Forms 338 and 409 (IPER) (PCT/JP01/01663) and translations thereof.

PCT Forms 338 and 409 (IPER) (PCT/JP00/09120) and translations thereof.

PCT Forms 338 and 409 (PCT/JP01/01928) and translations thereof.

PCT Forms 338 and 409 (PCT/JP01/01396) and translations thereof.

European Search Report (EP 27057) Jul. 18, 2000.

European Search Report (EP27279) Feb. 15, 2002.

PCT Forms 338 and 409 (IPER) (PCT/JP00/09121) and translations thereof.

Nam et al., "Lateral epitaxy of low defect density GaN layers via organometallic vapor phase epitaxy", pp. 2638–2640, Appl. Phys. Lett. 71 (18), Nov. 3, 1997.

Hiramatsu et al., "Selective area growth and epitaxial lateral overgrowth of GaN by metalorganic vapor phase epitaxy an hydride vapor phase epitaxy", pp. 104–111, Materials Science and Engineering B59 (1999).

Akasaki et al., "Effects of AlN Buffer Layer on Crystallographic Structure and on Electrical and Optical Properties of GaN and Ga1–xAlxN . . . Movpe" pp. 209–219, Journal of Crystal Growth 98 (1989) North–Holland, Amsterdam.

Yan et al., High quality GaN–InGaN heterostructures grown on (111) silicon substrates, pp. 3566–3568;, Appl. Phys. Lett. 69 (23), Dec. 2, 1996.

Wolf et al., for the VLSI Era, vol. 1—Process Technology, p. 5, "Silicon: Single Crystal Growth and Wafer Preparation."

Luther et al., "Titanium and titanium nitride contacts to n–type gallium nitride", Semicond. Sci. Technol. 13 (1998) pp. 1322–1327.

Uchida et al., "AlGaInN based Laser Diodes", In–Plans Semiconductor Lasers IV, III–Vs Review vol. 13, No. 3 May/Jun. 2000, pp. 156–164.

Zheleva et al., Pendeo–Epitaxy versus Lateral Epitaxial Overgrowth of GaN: A Comparative Study via Finite element Analysis, Journal of electronic Materials, vol. 28, No. 4, Apr. 1999, pp. 545–551.

* cited by examiner

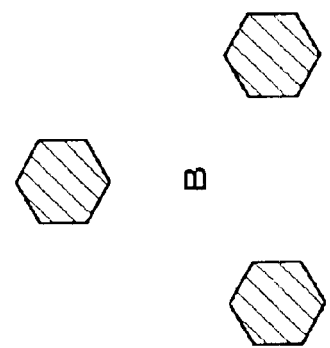
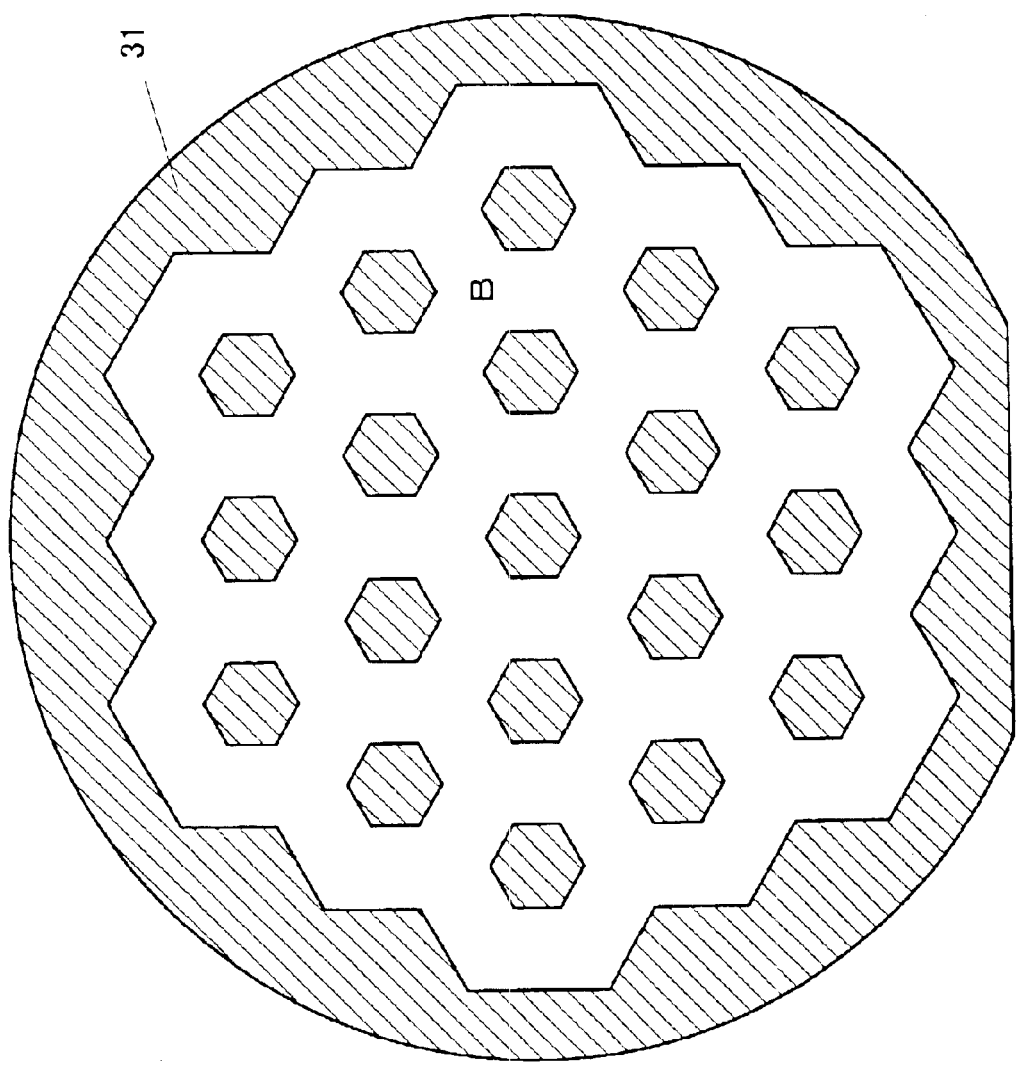

US 6,830,948 B2

METHOD FOR PRODUCING GROUP III NITRIDE COMPOUND SEMICONDUCTOR AND GROUP III NITRIDE COMPOUND SEMICONDUCTOR DEVICE

This is a patent application based on a PCT application No. PCT/JP00/09121, filed on Dec. 21, 2000, which is based on a Japanese patent application No. H11-367613, filed on Dec. 24, 1999, and is incorporated herein by reference.

BACKGROUND OF THE INVENTION

1. Field of the Invention

The present invention relates to a method for fabricating Group III nitride compound semiconductors. More particularly, the present invention relates to a method for fabricating Group III nitride compound semiconductors employing epitaxial lateral overgrowth (ELO). The Group III nitride compound semiconductors are generally represented by $Al_xGa_yIn_{1-x-y}N$ (wherein $0 \leq x \leq 1$, $0 \leq y \leq 1$, and $0 \leq x+y \leq 1$), and examples thereof include binary semiconductors such as AlN, GaN, and InN; ternary semiconductors such as $Al_xGa_{1-x}N$, and $Ga_xIn_{1-x}N$ (wherein $0 < x < 1$); and quaternary semiconductors such as $Al_xGa_yIn_{1-x-y}N$ (wherein $0 < x < 1$, $0 < y < 1$, and $0 < x+y < 1$). In the present specification, unless otherwise specified, "Group III nitride compound semiconductors" encompass Group III nitride compound semiconductors which are doped with an impurity so as to assume p-type or n-type conductivity.

2. Description of the Related Art

Group III nitride compound semiconductor are direct-transition semiconductors exhibiting a wide range of emission spectra from UV to red light when used in a device such as a light-emitting device, and have been used in light-emitting devices such as light-emitting diodes (LEDs) and laser diodes (LDs). In addition, due to their broad band gaps, devices employing the aforementioned semiconductors are expected to exhibit reliable operational characteristics at high temperature as compared with those employing semiconductors of other types, and thus application thereof to transistors such as FETs has been energetically studied. Moreover, since Group III nitride compound semiconductors contain no arsenic (As) as a predominant element, application of Group III nitride compound semiconductors to various semiconducting devices has been longed for from the environmental aspect. Generally, these Group III nitride compound semiconductors are formed on a sapphire substrate.

SUMMARY OF THE INVENTION

However, when a Group III nitride compound semiconductor is formed on a sapphire substrate, misfit-induced dislocations occur due to difference between the lattice constant of sapphire and that of the semiconductor, resulting in poor device characteristics. Misfit-induced dislocations are threading dislocations which penetrate semiconductor layers in a longitudinal direction (i.e., in a direction vertical to the surface of the substrate), and Group III nitride compound semiconductors are accompanied by the problem that dislocations in amounts of approximately $10^9$ cm$^{-2}$ propagate therethrough. The aforementioned dislocations propagate through layers formed from Group III nitride compound semiconductors of different compositions, until they reach the uppermost layer. When such a semiconductor is incorporated in, for example, a light-emitting device, the device poses problems of unsatisfactory device characteristics in terms of threshold current of an LD, service life of an LED or LD, etc. On the other hand, when a Group III nitride compound semiconductor is incorporated in any of other types of semiconductor devices, because electrons are scattered due to defects in the Group III nitride compound semiconductor, the semiconductor device comes to have low mobility. These problems are not solved even when another type of substrate is employed.

The aforementioned dislocations will next be described with reference to a sketch of FIG. 11. FIG. 11 shows a substrate 91, a buffer layer 92 formed thereon, and a Group III nitride compound semiconductor layer 93 further formed thereon. Conventionally, the substrate 91 is formed of sapphire or a similar substance and the buffer layer 92 is formed of aluminum nitride (AlN) or a similar substance. The buffer layer 92 formed of aluminum nitride (AlN) is provided so as to relax misfit between the sapphire substrate 91 and the Group III nitride compound semiconductor layer 93. However, generation of dislocations is not reduced to zero. Threading dislocations 901 propagate upward (in a vertical direction with respect to the substrate surface) from dislocation initiating points 900, penetrating the buffer layer 92 and the Group III nitride compound semiconductor layer 93. When a semiconductor device is fabricated by stacking various types of Group III nitride compound semiconductors of interest on the Group III nitride compound semiconductor layer 93, threading dislocations further propagate upward, through the semiconductor device, from dislocation arrival points 902 on the surface of the Group III nitride compound semiconductor layer 93. Thus, according to conventional techniques, problematic propagation of dislocations cannot be prevented during formation of Group III nitride compound semiconductor layers.

The present invention has been accomplished in an attempt to solve the aforementioned problems, and an object of the present invention is to fabricate a Group III nitride compound semiconductor with suppressed generation of threading dislocations.

In order to attain the aforementioned object, the invention drawn to a first feature provides a method for fabricating a Group III nitride compound semiconductor through epitaxial growth, which comprises using a mask, etching an underlying layer comprising at least one layer of a Group III nitride compound semiconductor, the uppermost layer of the underlying layer being formed of a first Group III nitride compound semiconductor, to thereby form an island-like structure, such as a dot-like, stripe-shaped, or grid-like structure, and epitaxially growing, vertically and laterally, a second Group III nitride compound semiconductor not grown on the mark epitaxially, with the mask remaining on the upper surface of the uppermost layer in the underlying layer of the trench and with a sidewall of a trench serving as a nucleus for epitaxial growth, the post and the trench being formed by etching the first Group III nitride compound semiconductor so as to form an island-like structure such as a dot-like, stripe-shaped, or grid-like structure. In the present specification, the term "underlying layer" is used so as to collectively encompass a Group III nitride compound semiconductor single layer and a multi-component layer containing at least one Group III nitride compound semiconductor layer. The second Group III nitride compound semiconductor layer which "not grown on the mask epitaxially" means that the second Group III nitride compound semiconductor layer hardly grows on the mask. Practically, it may be sufficient that the mask be covered by lateral epitaxial growth (ELO). The expression "island-like structure" conceptually refers to the pattern of the upper portions of the posts formed through etching, and does not necessarily refer to regions separated from one another. Thus, upper portions of the posts may be continuously connected together over a considerably wide area, and such a structure may be obtained by forming the entirety of a wafer into a stripe-shaped or grid-like structure. The sidewall/sidewalls of the trench refers not only to a plane vertical to the substrate plane and the surface of a Group III nitride compound semiconductor, but also to an oblique plane. The trench may have a V-shaped cross-section with no flat surface on the bottom of the trench. Unless otherwise specified, these definitions are equally applied to the below-appended claims.

The invention drawn to a second feature provides a method for fabricating a Group III nitride compound semiconductor wherein the underlying layer is formed on the substrate and the etching is carried out until the substrate is exposed.

The invention drawn to a third feature provides a method for fabricating a Group III nitride compound semiconductor according to the invention as recited in connection with the first feature, wherein the depth and the width of the trench are determined such that lateral growth from the sidewall/sidewalls for covering the trench proceeds faster than vertical growth from the bottom portion of the trench for burying the trench. As used herein, in the trench having a V-shaped cross-section with no flat surface on the bottom of the trench, the bottom portion of the trench means the bottom formed through epitaxial growth.

The invention drawn to a fourth feature provides a method for fabricating a Group III nitride compound semiconductor wherein substantially all the sidewalls of the trench are a {11–20} plane.

The invention drawn to a fifth feature provides a method for fabricating a Group III nitride compound semiconductor wherein the first Group III nitride compound semiconductor and the second Group III nitride compound semiconductor have the same composition. As used herein, the term "same composition" does not exclude differences on a doping level (differences by less than 1 mol %) from its meaning.

The invention drawn to a sixth feature provides a method for fabricating a Group III nitride compound semiconductor wherein the underlying layer comprises plural units of the buffer layer formed on the substrate and the Group III nitride compound semiconductor layer epitaxially grown thereon.

The invention drawn to a seventh feature provides a method for fabricating a Group III nitride compound semiconductor wherein compositions and a temperature for forming the buffer layer are different from those of the Group III nitride compound semiconductor layer formed adjacent to the buffer layer.

The invention drawn to an eighth feature provides a method for fabricating a Group III nitride compound semiconductor wherein a portion of the compositions in the first Group III nitride compound semiconductor layer is substituted for or doped with elements whose atomic radius is larger than that of predominant elements of the first Group III nitride compound semiconductor layer. Here the predominant elements are nitrogen (N) and Group III elements. The element of a large atomic radius is, i.e., phosphorus (P), arsenic (As), and bismuth (Bi), and Group III elements are aluminum (Al), gallium (Ga), indium (In), and thallium (Tl), arranging from smaller to larger atomic radius order.

The invention drawn to a ninth feature provides a method for fabricating a Group III nitride compound semiconductor according to the invention as recited in connection with any one of the first to eighth features, further comprising forming a second mask in order to cover the bottom surface of the trench before growing the second Group III nitride compound semiconductor layer epitaxially.

The invention drawn to a tenth feature provides a Group III nitride compound semiconductor device, comprising a single Group III nitride compound semiconductor layer or plural Group III nitride compound semiconductor layers functioning as a semiconductor device, on a portion of a Group III nitride compound semiconductor layer, provided lateral epitaxial growth, produced through a method for fabricating a Group III nitride compound semiconductor as recited in connection with any one of the first to ninth features.

The invention drawn to an eleventh feature provides a method for fabricating a Group III nitride compound semiconductor as recited in connection with any one of the first to ninth features, further comprising removing substantially entire portions except for an upper layer formed on a portion provided through lateral epitaxial growth, to thereby obtain a Group III nitride compound semiconductor layer.

The outline of an example of the method for fabricating a Group III nitride compound semiconductor of the present invention will next be described with reference to FIG. 1. Although FIG. 1 illustrates layers accompanied by a substrate 1 and a buffer layer 2 so as to facilitate description and understanding of relevant dependent claims, the substrate 1 and the buffer layer 2 are not essential elements of the present invention, as the present invention is to produce a Group III nitride compound semiconductor layer including a region in which threading dislocations in the vertical direction are reduced from a Group III nitride compound semiconductor having threading dislocations in the vertical direction. The gist of the operation and effects of the present invention will next be described with reference to an embodiment in which a Group III nitride compound semiconductor layer 31 having threading dislocations in the vertical direction (direction vertical to the substrate surface) is provided on the substrate 1 via the buffer layer 2.

As shown in FIG. 1A, the first Group III nitride compound semiconductor layer 31 is formed as an underlying layer by etching with a mask 4 to thereby form an island-like structure such as a dot-like, stripe-shaped, or grid-like structure, so as to provide a trench/post. Thus, a second Group III nitride compound layer 32, which is not grown on the mask 4 epitaxially, can be epitaxially grown, vertically and laterally without removing the mask 4 formed on a top surface of the post and with a sidewall/sidewalls of the trench serving as a nucleus for epitaxial growth, to thereby bury the trench and also grow the layer upward. In this case, propagation of threading dislocations contained in the Group III nitride compound semiconductor layer 31 can be prevented in the upper portion of the second Group III nitride compound semiconductor 32 that is formed through lateral epitaxial growth, and a region in which treading dislocations are reduced is provided in the thus-buried trench (first feature). The second Group III nitride compound semiconductor layer 32 which is epitaxially grown vertically and laterally, as shown in FIG. 1B, comprises a portion grown with sidewalls of the trench serving as a nucleus for epitaxial growth and a portion grown with bottom layer (bottom portion) of the trench serving as a nucleus for epitaxial growth. The rate of epitaxial growth in vertical direction is substantially the same as that in lateral direction. Accordingly, epitaxial growth in the present invention should be carried out so that a portion with sidewalls of the trench serving as a nucleus for epitaxial growth exists. Because of epitaxial growth, discontinuous interface of the Group III nitride compound semiconductor layer 31 and the second Group III nitride compound semiconductor layer 32 hardly exists, that results in obtaining a stabilized structure. Epitaxial growth of the second Group III nitride compound semiconductor 32 vertically and laterally is carried out until the mask 4 is covered thereby (FIGS. 1D and 1E). Because the second Group III nitride compound semiconductor layer 32 formed on the mask 4 did not grow epitaxially from the upper surface of the mask 4, new dislocation cannot be generated.

In etching the underlying layer, when we expose the substrate, or further etch a portion of the substrate, epitaxial growth in lateral direction is surely realized. That is because the second Group III nitride compound semiconductor layer has difficulty to grow on the substrate surface serving as a nucleus. As a result, threading dislocations remaining at the underlying layer can be ideally removed, and crystallinity of the second Group III nitride compound semiconductor layer which is epitaxially grown in lateral direction is surely improved (second feature).

When the rate that the second Group III nitride compound semiconductor 32, which buries the trench, epitaxially grows in lateral direction from sidewalls of the trench and coalescences to the lateral epitaxial growth layer starting from the sidewall of the trench facing to each other is faster than the rate of epitaxial growth in vertical direction from the bottom layer (bottom portion) to the upper layer of the trench, threading dislocations propagated from the first Group III nitride compound semiconductor layer 31 is remarkably suppressed in the upper portion of the thus-buried Group III nitride compound semiconductor 32, to thereby provide a crystal region of remarkably high quality (third feature). In this case, as shown in FIG. 1C, a portion which is grown from the bottom portion of the trench serving as a nucleus is not exposed at the surface but remains as cavities. And over the cavities, growth fronts of the Group III nitride compound semiconductor 32 grown from the two sidewalls of the trench, serving as nuclei, coalesce. The propagation of threading dislocations from the first Group III nitride compound semiconductor can be prevented at the cavities. Also, the structure of the device can be stabilized.

The aforementioned lateral epitaxial growth can be readily attained when the sidewall formed of the Group III nitride compound semiconductor layer 31 is a {11–20} plane (fourth feature). During lateral epitaxial growth, at least a top of the growth front may remain a {11–20} plane. When the first Group III nitride compound semiconductor and the second Group III nitride compound semiconductor have the same composition, rapid lateral epitaxial growth can be readily attained (fifth feature).

Through the procedure as described above, threading dislocations propagated from the Group III nitride compound semiconductor layer 31 are prevented, to thereby provide a stable structure, and the Group III nitride compound semiconductor 32 can be formed without increasing electrical resistance attributed to a discontinuous interface. Although FIG. 1 illustrates a sidewall of the trench vertical to the substrate plane, the present invention is not limited thereto, and the sidewall may be an oblique plane. The trench may have a V-shaped cross-section with not flat surface on the bottom of the trench. These features are equally applied to the descriptions below.

The underlying layer comprises arbitrary units of the buffer layer formed on the substrate and the Group III nitride compound semiconductor layer thereon, and each of the buffer layer functions to decrease threading dislocations (sixth feature). Here compositions and a temperature for forming the buffer layer are different from those of the Group III nitride compound semiconductor layer formed adjacent to the buffer layer (seventh feature). This is shown in FIG. 6A.

Because the Group III nitride compound semiconductor has crystalline expansion strain induced by defects of nitrogen atoms, doping elements whose atomic radius is larger than that of predominant elements generates compression strain, to thereby improve crystallinity (eighth feature). For example, by doping indium (In), which is larger in atomic radius than aluminum (Al) and gallium (Ga), or arsenic (As), which is larger in atomic radius than nitrogen (N), to a Group III nitride compound semiconductor which is represented by $Al_xGa_{1-x}N$ ($0 \leq x \leq 1$) and which does not contain indium (In) and arsenic (As), crystalline expansion strain induced by defects of nitrogen atoms can be compensated by compression strain, to thereby provide improved crystallinity of the Group III nitride compound semiconductor layer 31. In this case, since acceptor impurities easily occupy the positions of Group III atoms, p-type crystals can be obtained as grown. Through the thus-attained improvement of crystallinity combined with the features of the present invention, threading dislocation can be further reduced to approximately $\frac{1}{100}$ to $\frac{1}{1000}$. In the case of an underlying layer comprising two or more repetitions of a buffer layer and a Group III nitride compound semiconductor layer, the Group III nitride compound semiconductor layers are further preferably doped with an element greater in atomic radius than a predominant component element.

When the bottom surface of the trench is covered by the second mask, vertical growth from the surface of the substrate can be completely prevented (ninth feature). That is shown in FIGS. 6C and 6D.

By forming a semiconductor device, e.g., a light-emitting device or an FET, on a portion of a Group III nitride compound semiconductor layer that is formed through lateral epitaxial growth through the above step, an improved service life time and mobility and an improved threshold value for LD can be obtained (tenth feature).

By selectively separating, from the other layers, an upper layer formed on a portion of the Group III nitride compound semiconductor layer that is formed through lateral epitaxial growth through the above step, there can be produced a high-crystallinity Group III nitride compound semiconductor in which crystal defects such as dislocations are remarkably suppressed (eleventh feature). In this connection, for the sake of convenience in manufacture, the expression "removing substantially entire portions" does not exclude the case in which a portion containing threading dislocations is present to some extent.

BRIEF DESCRIPTION OF THE DRAWINGS

FIG. 10 is a schematic view showing another example of etching of a first Group III nitride compound semiconductor.

BEST MODE FOR CARRYING OUT THE INVENTION

Figure 1A:
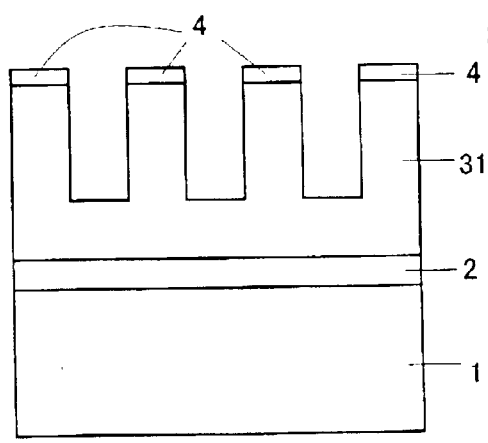
FIG. 1 is a series of sectional views showing the steps of fabricating a Group III nitride compound semiconductor according to a first embodiment of the present invention.
Figure 1D:
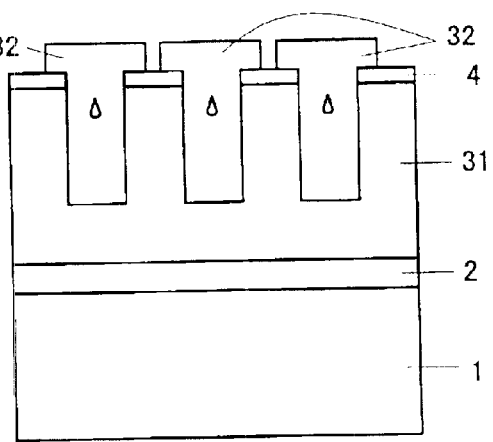

FIG. 1 schematically shows a mode for carrying out a method for fabricating a Group III nitride compound semiconductor of the present invention. A substrate 1, the buffer layer 2, a first Group III nitride compound semiconductor layer 31, and a mask 4 are formed, followed by undergoing etching a portion on which the mask 4 is not formed to form trenches (FIG. 1A). As a result of etching, posts and trenches are formed; the unetched surface forms the tops of the posts; and sidewalls and bottom portions (bottom surfaces) of the trenches are formed. The sidewalls are, for example, {11-20} planes. Next, under conditions of lateral epitaxial growth, a second Group III nitride compound semiconductor 32 is epitaxially grown while the sidewalls of the trenches serve as nuclei for epitaxial growth. Here the mask 4 on which the second Group III nitride compound semiconductor layer 32 does not epitaxially grow is used. A metal-organic growth process enables easy lateral epitaxial growth while the growth fronts remain the {11-20} planes. Portions of the second Group III nitride compound semiconductor 32 which are laterally grown from the sidewalls of the trenches are free from propagation of threading dislocation from the first Group III nitride compound semiconductor layer (FIG. 1B). The form of etching and lateral epitaxial growth conditions are determined such that the fronts of lateral growth extending from the opposite sidewalls of the trenches coalesce above the bottoms of the trenches before the etched portion is buried by vertical growth from the bottom portion of the trench, whereby threading dislocation is suppressed in the regions of the second Group III nitride compound semiconductor 32 formed above the bottoms of the trenches (FIG. 1C). Then epitaxial growth in vertical and lateral directions is carried out, to thereby obtaining the second Group III nitride compound semiconductor layer 32 which also covers the mask 4.

The above-described mode for carrying out the invention allow selections and modifications to be described below.

When a laminate including a substrate and a Group III nitride compound semiconductor is to be formed, the substrate may be an inorganic crystalline substrate of sapphire, silicon (Si), silicon carbide (SiC), spinel ($MgAl_2O_4$), ZnO, MgO, or the like, and a Group III-V compound semiconductor, such as a gallium phosphide or gallium arsenide semiconductor, or a Group III nitride compound semiconductor, such as a gallium nitride (GaN) semiconductor, may be used.

A preferred process for forming a Group III nitride compound semiconductor layer is metal-organic chemical vapor deposition (MOCVD) or metal-organic vapor phase epitaxy (MOVPE). However, molecular beam epitaxy (MBE), halide vapor phase epitaxy (halide VPE), liquid phase epitaxy (LPE), or the like may be used. Also, individual layers may be formed by different growth processes.

When a Group III nitride compound semiconductor layer is to be formed on, for example, a sapphire substrate, in order to improve good crystallinity of the layer, a buffer layer is preferably formed for the purpose of correcting lattice mismatch with the sapphire substrate. When a substrate of another material is to be used, employment of a buffer layer is also preferred. A buffer layer is preferably of a Group III nitride compound semiconductor $Al_xGa_yIn_{1-x-y}N$ ($0 \leq x \leq 1$, $0 \leq y \leq 1$, $0 \leq x+y \leq 1$) formed at low temperature, more preferably of $Al_xGa_{1-x}N$ ($0 \leq x \leq 1$). This buffer layer may be a single layer or a multi-component layer comprising layers of different compositions. A buffer layer may be formed by MOCVD at a low temperature of 380–420° C. or at a temperature of 1000–1180° C. Alternatively, an AlN buffer layer can be formed by a reactive sputtering process using a DC magnetron sputtering apparatus and, as materials, high-purity aluminum and nitrogen gas. Similarly, a buffer layer represented by the formula $Al_xGa_yIn_{1-x-y}N$ ($0 \leq x \leq 1$, $0 \leq y \leq 1$, $0 \leq x+y \leq 1$, arbitrary composition) can be formed. Furthermore, vapor deposition, ion plating, laser abrasion, or ECR can be employed. When a buffer layer is to be formed by physical vapor deposition, physical vapor deposition is performed preferably at 200–600° C., more preferably 300–500° C., most preferably 400–500° C. When physical vapor deposition, such as sputtering, is employed, the thickness of a buffer layer is preferably 100–3000 angstroms, more preferably 100–400 angstroms, most preferably 100–300 angstroms. A multi-component layer may comprise, for example, alternating $Al_xGa_{1-x}N$ ($0 \leq x \leq 1$) layers and GaN layers. Alternatively, a multi-component layer may comprise alternating layers of the same composition formed at a temperature of not higher than 600° C. and at a temperature of not lower than 1000° C. Of course, these arrangements may be combined. Also, a multi-component layer may comprise three or more different types of Group III nitride compound semiconductors $Al_xGa_yIn_{1-x-y}N$ ($0 \leq x \leq 1, 0 \leq y \leq 1, 0 \leq x+y \leq 1$). Generally, a buffer layer is amorphous and an intermediate layer is monocrystalline. Repetitions of unit of a buffer layer and an intermediate layer may be formed, and the number of repetitions is not particularly limited. The greater the number of repetitions, the greater the improvement in crystallinity.

The present invention is substantially applicable even when the composition of a buffer layer and that of a Group III nitride compound semiconductor formed on the buffer layer are such that a portion of Group III elements are replaced with boron (B) or thallium (Tl) or a portion of nitrogen (N) atoms are replaced with phosphorus (P), arsenic (As), antimony (Sb), or bismuth (Bi). Also, the buffer layer and the Group III nitride compound semiconductor may be doped with any one of these elements to such an extent as not to appear in the composition thereof. For example, a Group III nitride compound semiconductor which is represented by $Al_xGa_{1-x}N$ ($0 \leq x \leq 1$) and which does not contain indium (In) and arsenic (As) may be doped with indium (In), which is larger in atomic radius than aluminum (Al) and gallium (Ga), or arsenic (As), which is larger in atomic radius than nitrogen (N), to thereby improve crystallinity through compensation, by means of compression strain, for crystalline expansion strain induced by dropping off of nitrogen atoms. In this case, since acceptor impurities easily occupy the positions of Group III atoms, p-type crystals can be obtained as grown. Through the thus-attained improvement of crystallinity combined with the features of the present invention, threading dislocation can be further reduced to approximately $\frac{1}{100}$ to $\frac{1}{1000}$. In the case of an underlying layer comprising two or more repetitions of a buffer layer and a Group III nitride compound semiconductor layer, the Group III nitride compound semiconductor layers are further preferably doped with an element greater in atomic radius than a predominant component element. In the case where an emission layer or an active layer in a light-emitting device is a target product, use of a binary or ternary Group III nitride compound semiconductor is preferred.

When an n-type Group III nitride compound semiconductor layer is to be formed, a Group IV or Group VI element, such as Si, Ge, Se, Te, or C, can be added as an n-type impurity. A Group II or Group IV element, such as Zn, Mg, Be, Ca, Sr, or Ba, can be added as a p-type impurity. The same layer may be doped with a plurality of n-type or p-type impurities or doped with both n-type and p-type impurities.

Preferably, the front of lateral epitaxial growth is perpendicular to a substrate. However, lateral epitaxial growth may progress while slant facets with respect to the substrate are maintained. In this case, trenches may have a V-shaped cross section with no flat surface on the bottom of the trench.

Preferably, lateral epitaxial growth progresses such that at least an upper portion of the front of lateral epitaxial growth is perpendicular to the surface of a substrate. More preferably, growth fronts are {11–20} planes of a Group III nitride compound semiconductor.

The depth and width of trenches to be etched may be determined such that lateral epitaxial growth fills the trenches. When exposing the substrate surface, the phenomenon that vertical growth from the surface of a substrate is very slow in at least the initial stage of growth is used.

When the buffer layer as one layer constructing the underlying layer is formed from AlN, $Al_xGa_{1-x}N$, or $Al_xGa_yIn_{1-x-y}N$ ($x \neq 0$) and the first Group III nitride compound semiconductor as the uppermost layer is a GaN semiconductor, the different layer formed from AlN, $Al_xGa_{1-x}N$, or $Al_xGa_yIn_{1-x-y}N$ ($x \neq 0$) serves favorably as a stopper layer during plasma etching involving chlorine in the form of, for example, $Cl_2$ or $BCl_3$. These layers can be also etched in each condition of etching.

When the crystal orientation of a Group III nitride compound semiconductor layer to be formed on a substrate can be predicted, masking or etching in the form of stripes perpendicular to the a-plane ({11–20} plane) or the m-plane ({1–100} plane) of the Group III nitride compound semiconductor layer is favorable. The aforementioned stripe or mask patterns may be island-like or grid-like or may assume other forms. The front of lateral epitaxial growth may be perpendicular or oblique to the surface of a substrate. In order for the a-plane; i.e., the (11–20) plane, of a Group III nitride compound semiconductor layer to become the front of lateral epitaxial growth, the lateral direction of stripes must, for example, be perpendicular to the m-plane; i.e., the (1–100) plane, of the Group III nitride compound semiconductor layer. For example, when the surface of a substrate is the a-plane or the c-plane of sapphire, the m-plane of sapphire usually matches the a-plane of a Group III nitride compound semiconductor layer formed on the substrate. Thus, etching is performed according to the arrangement of the planes. In the case of a point-like, grid-like, or island-like etching, planes that define an outline (sidewalls) are preferably {11–20} planes.

An etching mask may comprise a polycrystalline semiconductor, such as polycrystalline silicon or polycrystalline nitride semiconductor; an oxide or nitride, such as silicon oxide ($SiO_x$), silicon nitride ($SiN_x$), titanium oxide ($TiO_x$), or zirconium oxide ($ZrO_x$); or a high-melting-point metal, such as titanium (Ti) or tungsten (W); or may assume the form of a multi-layer film thereof. The etching mask may be formed by a vapor phase growth process, such as vapor deposition, sputtering, or CVD, or other processes.

Reactive ion beam etching (RIE) is preferred for etching, but any other etching process may be employed. When trenches having sidewalls oblique to the surface of a substrate are to be formed, anisotropic etching is employed. By means of anisotropic etching, trenches are formed such that the trenches have a V-shaped cross section with no flat surface on the bottom of the trench.

A semiconductor device, such as an FET or a light-emitting device, can be formed on the above-described Group III nitride compound semiconductor having regions where threading dislocation is suppressed, throughout the entire region or mainly on the regions where threading dislocation is suppressed. In the case of a light-emitting device, a light-emitting layer assumes a multi-quantum well (MQW) structure, a single-quantum well (SQW) structure, a homo-structure, a single-hetero-structure, or a double-hetero-structure, or may be formed by means of, for example, a pin junction or a pn junction.

The above-described Group III nitride compound semiconductor having regions where threading dislocation is suppressed can be formed as a Group III nitride compound semiconductor substrate through removal of, for example, the substrate 1, the buffer layer 2, and portions of the Group III nitride compound semiconductor where threading dislocation is not suppressed. The thus-formed substrate allows formation of a Group III nitride compound semiconductor device thereon or may be used as a substrate for forming a greater Group III nitride compound semiconductor crystal. The removal can be performed by mechanochemical polishing or any other appropriate process.

The present invention will next be described with reference to specific embodiments. The embodiments will be described while mentioning a method for fabricating a light-emitting device. However, the present invention is not limited to the embodiments to be described below. The present invention discloses a method for fabricating a Group III nitride compound semiconductor applicable to fabrication of any device.

The Group III nitride compound semiconductor of the present invention was fabricated by metal-organic vapor phase epitaxy (hereinafter called "MOVPE"). Typical gases used include ammonia ($NH_3$), carrier gas ($H_2$ or $N_2$), trimethylgallium ($Ga(CH_3)_3$, hereinafter called "TMG"), trimethylaluminum ($Al(CH_3)_3$, hereinafter called "TMA"), trimethylindium ($In(CH_3)_3$, hereinafter called "TMI"), and cyclopentadienylmagnesium ($Mg(C_5H_5)_2$, hereinafter called "$Cp_2Mg$").

First Embodiment

A monocrystalline sapphire substrate 1 was prepared such that the a-plane thereof cleaned through organic cleaning and heat treatment serves as the main surface thereof. Temperature was dropped to 400° C., and $H_2$ (10 L/min), $NH_3$ (5 L/min), and TMA (20 μmol/min) were supplied for approximately 3 minutes to thereby form, on the sapphire substrate 1, a buffer layer 2 of AlN having a thickness of approximately 40 nm. Next, while the temperature of the sapphire substrate 1 was maintained at 1000° C., $H_2$ (20 L/min), $NH_3$ (10 L/min), and TMG (300 μmol/min) were introduced to thereby form a GaN layer 31 having a thickness of approximately 3 μm.

By sputtering tungsten (W), a mask 4 was formed. Stripe-shaped trenches each having a width of 1 μm and a depth of 0.5 μm were selectively dry-etched at intervals of 1 μm by reactive ion beam etching (RIE). As a result, posts of the GaN layer 31 covered by the mask 4 each having a width of 1 μm and a height of 2 μm and bottom layers (bottom portions) each having a width of 1 μm were alternatingly formed (FIG. 1A). At this time, the {11–20} planes of the GaN layer 31 were caused to serve as the sidewalls of the trenches of a depth of 2 μm.

Figure 1B:
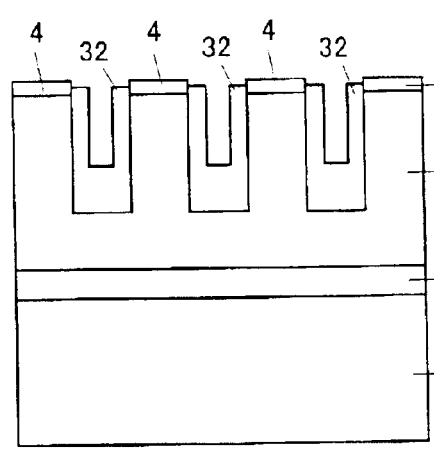
Figure 1E:
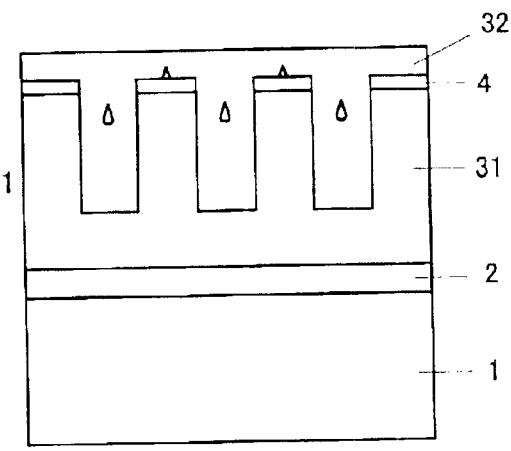
Figure 1C:
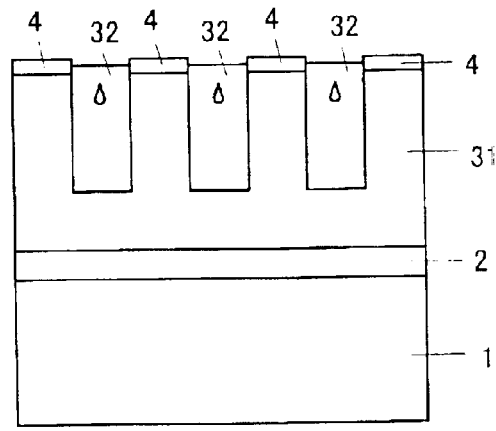

Next, while the temperature of the sapphire substrate 1 was maintained at 1150° C., $H_2$ (20 L/min), $NH_3$ (10 L/min), and TMG (5 μmol/min) were introduced to thereby form a GaN layer 32 through lateral epitaxial growth performed while the sidewalls of the trenches of a depth of 2 μm; i.e., the {11–20} planes of the GaN layer 31, serve as nuclei. At this time, epitaxial growth took place from the bottom surface of the trenches (FIG. 1B). Lateral epitaxial growth was performed while the {11–20} planes primarily served as the growth fronts, thereby filling the trenches and thus establishing a flat top surface (FIG. 1C). Subsequently, $H_2$ (20 L/min), $NH_3$ (10 L/min), and TMG (300 μmol/min) were introduced to thereby grow the GaN layer 32 such that the total thickness of the GaN layer 31 and the GaN layer 32 becomes 4 μm. In contrast to portions of the GaN layer of the posts, portions of the GaN layer 32 formed above the bottoms of the trenches extending as deep as 2 μm through the GaN layer 31 exhibited significant suppression of threading dislocation.

Second Embodiment

Figure 2:
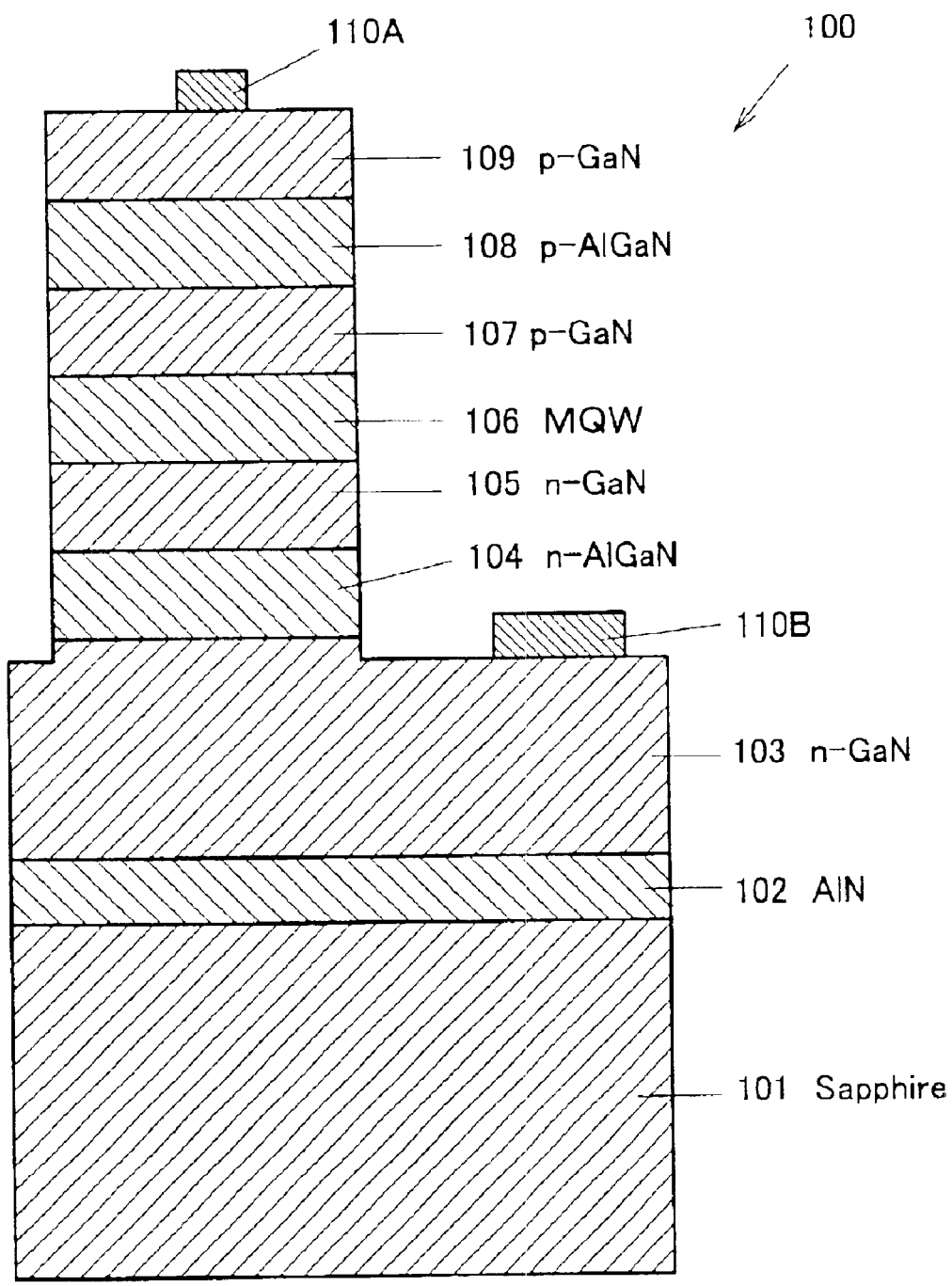
FIG. 2 is a series of sectional views showing the steps of fabricating a Group III nitride compound semiconductor light-emitting device according to a second embodiment of the present invention.

FIG. 2 is a sectional view showing a laser diode (LD) 100 according to a second embodiment of the present invention. On a wafer formed in a manner similar to that of the first embodiment, a laser diode (LD) was formed in the following manner. Notably, in formation of the GaN layer 32, silane ($SiH_4$) was introduced so as to form a silicon (Si)-doped n-type GaN layer serving as the GaN layer 33. For the sake of simplified illustration, the drawing merely illustrates a GaN layer 103 including the mask 4 to inclusively represent the GaN layer 31 and the GaN layer 32.

On a wafer comprising a sapphire substrate 101, a buffer layer 102 of AlN, and the two-layered GaN layer 103 consisting of a GaN layer and an n-type GaN layer, an n-clad layer 104 of silicon (Si)-doped $Al_{0.08}Ga_{0.92}N$, an n-guide layer 105 of silicon (Si)-doped GaN, an MQW-structured light-emitting layer 106, a p-guide layer 107 of magnesium (Mg)-doped GaN, a p-clad layer 108 of magnesium (Mg)-doped $Al_{0.08}Ga_{0.92}N$, and a p-contact layer 109 of magnesium (Mg)-doped GaN were formed. Next, an electrode 110A of gold (Au) was formed on the p-contact layer 109. Etching was partially performed until the two-layered GaN layer 103 consisting of the GaN layer and the n-type GaN layer was exposed (FIG. 2). On the exposed GaN layer 103, an electrode 110B of aluminum (Al) was formed. The thus-formed laser diode (LD) exhibited the improvement of device life time and light-emitting efficiency.

Third Embodiment

Figure 3:
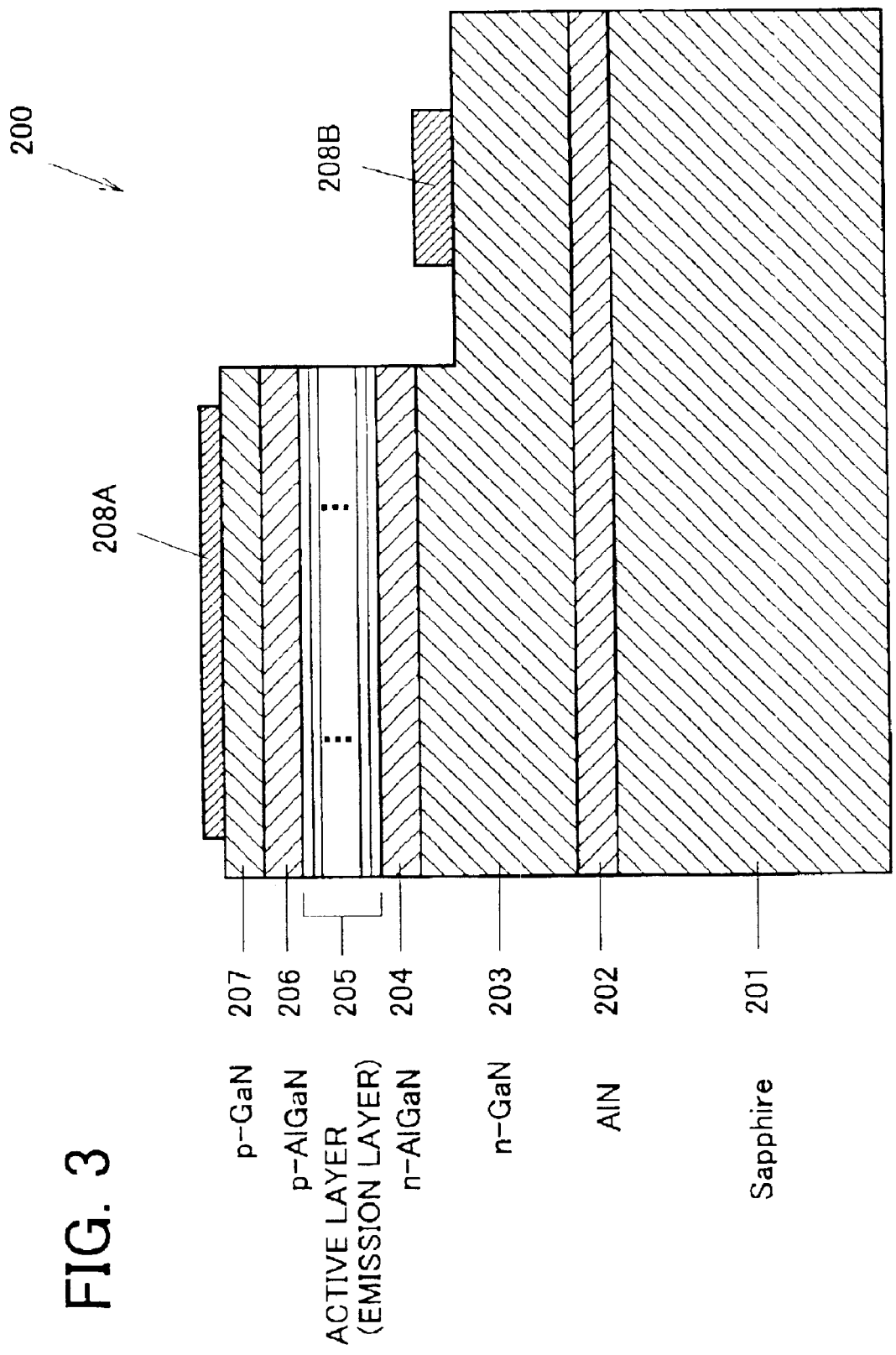
FIG. 3 is a series of sectional views showing the steps of fabricating a Group III nitride compound semiconductor light-emitting device according to a third embodiment of the present invention.

FIG. 3 is a sectional view showing a light-emitting diode (LED) 200 according to a third embodiment of the present invention. On a wafer formed in a manner similar to that of the first embodiment, a light-emitting diode (LED) was formed in the following manner. Notably, in formation of the GaN layer 32, silane ($SiH_4$) was introduced so as to form a silicon (Si)-doped n-type GaN layer serving as the GaN layer 32. For the sake of simplified illustration, the drawing merely illustrates a GaN layer 203 including the mask 4 to inclusively represent the GaN layer 31 and the GaN layer 32.

On a wafer comprising a sapphire substrate 201, a buffer layer 202 of AlN, and the two-layered GaN layer 203 consisting of a GaN layer and an n-type GaN layer, an n-clad layer 204 of silicon (Si)-doped $Al_{0.08}Ga_{0.92}N$, a light-emitting layer 205, a p-clad layer 206 of magnesium (Mg)-doped $Al_{0.08}Ga_{0.92}N$, and a p-contact layer 207 of magnesium (Mg)-doped GaN were formed. Next, an electrode 208A of gold (Au) was formed on the p-contact layer 207. Etching was partially performed until the two-layered GaN layer 203 consisting of the GaN layer and the n-type GaN layer was exposed. On the exposed GaN layer 203, an electrode 208B of aluminum (Al) was formed (FIG. 3). The thus-formed light-emitting diode (LED) 200 exhibited the improvement of device life time and light-emitting efficiency.

Fourth Embodiment

Figure 4:
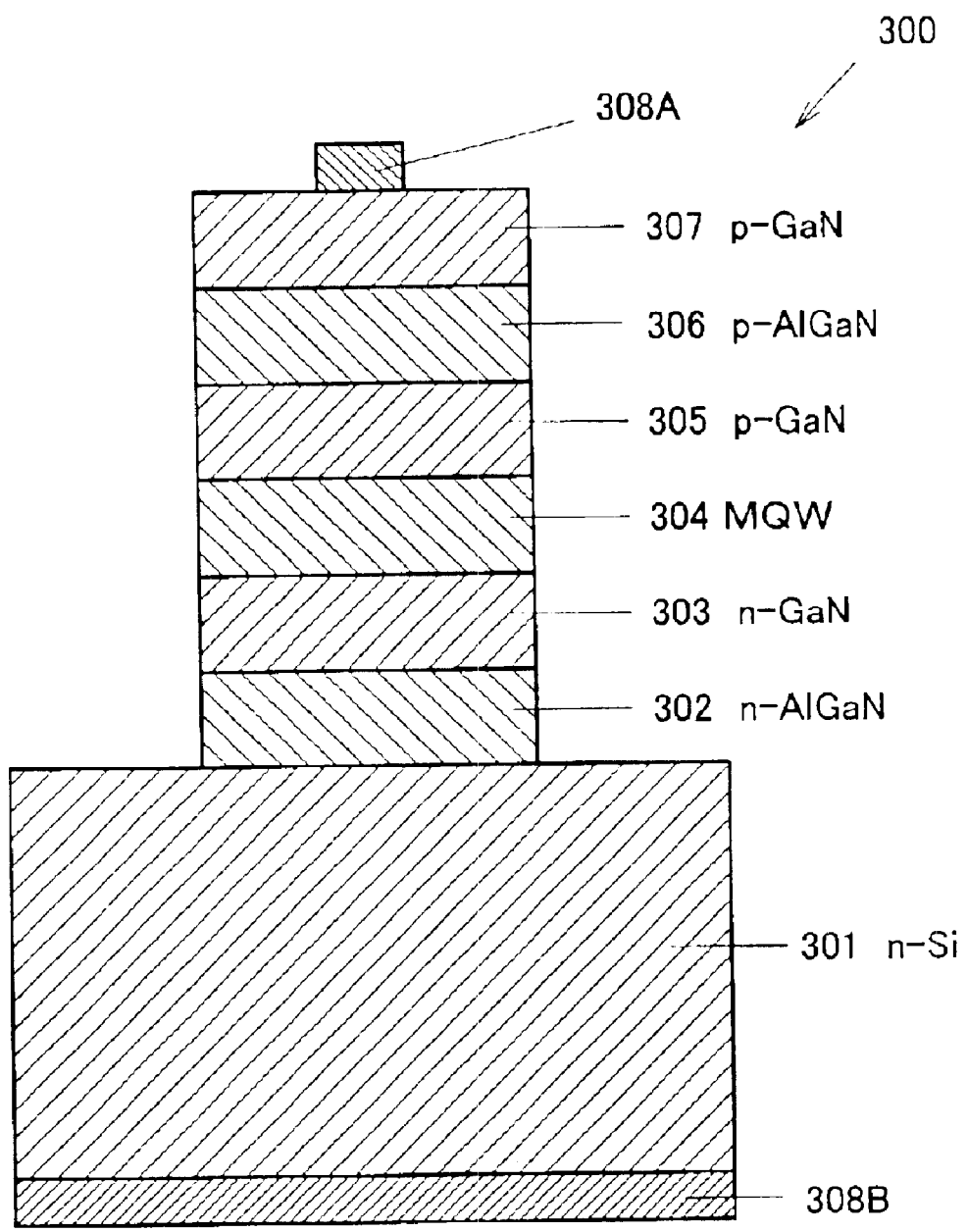
FIG. 4 is a series of sectional views showing the steps of fabricating a Group III nitride compound semiconductor light-emitting device according to a fourth embodiment of the present invention.

FIG. 4 is a sectional view showing a laser diode (LD) 300 according to a fourth embodiment of the present invention. The present embodiment used an n-type silicon (Si) substrate. On the n-type silicon (Si) substrate 301, a silicon (Si)-doped $Al_{0.15}Ga_{0.85}N$ layer 3021 having a thickness of 3 μm was formed at a temperature of 1150° C. through supply of $H_2$ (10 L/min), $NH_3$ (10 L/min), TMG (100 μmol/min), TMA (10 μmol/min), and silane ($SiH_4$) diluted with $H_2$ gas to 0.86 ppm (0.2 μmol/min). By sputtering tungsten (W), the mask 4 was formed. Next, stripe-shaped trenches each having a width of 1 μm and a depth of 2 μm were selectively dry-etched at intervals of 1 μm by reactive ion etching (RIE). As a result, posts of the n-$Al_{0.15}Ga_{0.85}N$ layer 3021 covered by the mask 4 and each having a width of 1 μm and a height of 2 μm and trenches each having a width of 1 μm were alternatingly formed. At this time, the {11–20} planes of the n-$Al_{0.15}Ga_{0.85}N$ layer 3021 were caused to serve as the sidewalls of the trenches of a depth of 2 μm.

Next, while the temperature of the n-type silicon substrate 301 was maintained at 1150° C., $H_2$ (20 L/min), $NH_3$ (10 L/min), TMG (5 μmol/min), TMA (0.5 μmol/min), and silane ($SiH_4$) diluted with $H_2$ gas (0.01 μmol/min) were introduced to thereby for an n-$Al_{0.15}Ga_{0.85}N$ layer 3022 through lateral epitaxial growth performed while the sidewalls of the trenches of a depth of 2 μm; i.e., the {11–20} planes of the n-$Al_{0.15}Ga_{0.85}N$ layer 3021, serve as nuclei. At this time, epitaxial growth took place from the bottoms of the trenches. Lateral epitaxial growth was performed while the {11–20} planes primarily served as the growth fronts, thereby filling the trenches and thus establishing a flat top surface. Subsequently, $H_2$ (10 L/min), $NH_3$ (10 L/min), TMG (100 μmol/min), TMA (10 μmol/min), and silane ($SiH_4$) diluted with $H_2$ gas (0.2 μmol/min) were introduced to thereby grow the n-Al$_{0.15}$Ga$_{0.85}$N layer 3022 such that the total thickness of the n-Al$_{0.15}$Ga$_{0.85}$N layer 3021 and the n-Al$_{0.15}$Ga$_{0.85}$N layer 3022 becomes 3 μm. Hereinafter, the n-Al$_{0.15}$Ga$_{0.85}$N layer 3021, the n-Al$_{0.15}$Ga$_{0.85}$N layer 3022, and the mask 4 having a total thickness of 4 μm are inclusively represented by an n-Al$_{0.15}$Ga$_{0.85}$N layer 302.

On the n-Al$_{0.15}$Ga$_{0.85}$N layer 302 formed on the n-type silicon substrate 301, an n-guide layer 303 of silicon (Si)-doped GaN, an MQW-structured light-emitting layer 304, a p-guide layer 305 of magnesium (Mg)-doped GaN, a p-clad layer 306 of magnesium (Mg)-doped Al$_{0.08}$Ga$_{0.92}$N, and a p-contact layer 307 of magnesium (Mg)-doped GaN were formed. Next, an electrode 308A of gold (Au) was formed on the p-contact layer 307, and an electrode 308B of aluminum (Al) was formed on the back side of the silicon substrate 301 (FIG. 4). The thus-formed laser diode (LD) 300 exhibited the improvement of device life time and light-emitting efficiency.

Fifth Embodiment

Figure 5:
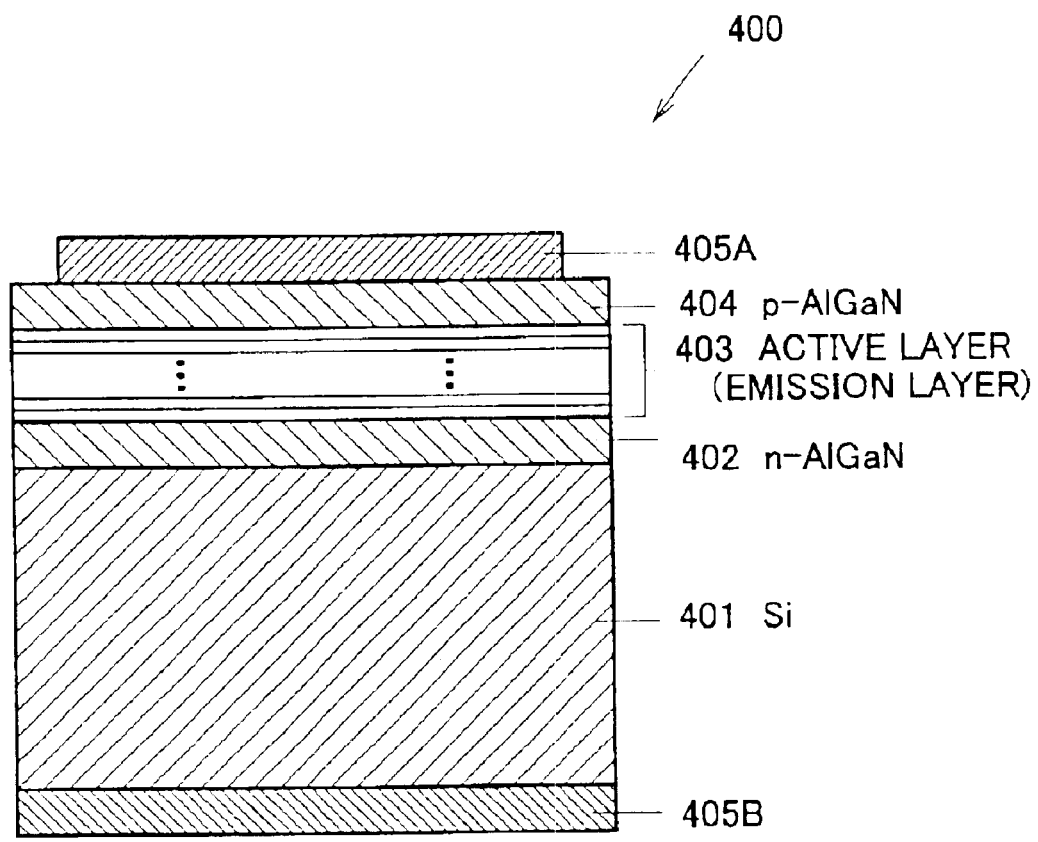
FIG. 5 is a sectional view showing the structure of a Group III nitride compound semiconductor light-emitting device according to a fifth embodiment of the present invention.

FIG. 5 is a sectional view showing a light-emitting diode (LED) 400 according to a fifth embodiment of the present invention. The present embodiment used an n-type silicon (Si) substrate. As in the fourth embodiment which used a wafer comprising the n-type silicon substrate 301 and the n-Al$_{0.15}$Ga$_{0.85}$N layer 302 formed thereon, the present embodiment prepared a wafer comprising an n-type silicon substrate 401 and an Al$_{0.15}$Ga$_{0.85}$N layer 402 formed on the substrate 401. On the wafer, a light-emitting layer 403 and a p-clad layer 404 of magnesium (Mg)-doped Al$_{0.15}$Ga$_{0.85}$N were formed. Next, an electrode 405A of gold (Au) was formed on the p-clad layer 404, and an electrode 405B of aluminum (Al) was formed on the back side of the silicon substrate 401. The thus-formed light-emitting diode (LED) exhibited the improvement of device life time and light-emitting efficiency.

Sixth Embodiment

The present embodiment used an underlying layer comprising multiple layers as shown in FIG. 6. A monocrystalline sapphire substrate 1 was prepared such that the a-plane thereof cleaned through organic cleaning and heat treatment serves as the main surface thereof. Temperature was dropped to 400° C., and H$_2$ (10 L/min), NH$_3$ (5 L/min), and TMA (20 μmol/min) were supplied for approximately 3 minutes to thereby form, on the sapphire substrate 1, a first AlN layer (first buffer layer) 21 having a thickness of approximately 40 nm. Next, while the temperature of the sapphire substrate 1 was maintained at 1000° C., H$_2$ (20 L/min), NH$_3$ (10 L/min), and TMG (300 μmol/min) were introduced to thereby form a GaN layer (intermediate layer) 22 having a thickness of approximately 0.3 μm. Next, the temperature was dropped to 400° C., and H$_2$ (10 L/min), NH$_3$ (5 L/min), and TMA (20 μmol/min) were supplied for approximately 3 minutes to thereby form a second AlN layer (second buffer layer) 23 having a thickness of approximately 40 nm. Next, while the temperature of the sapphire substrate 1 was maintained at 1000° C., H$_2$ (20 L/min), NH$_3$ (10 L/min), and TMG (300 μmol/min) were introduced to thereby form a GaN layer 31 having a thickness of approximately 2 μm. Thus was formed an underlying layer 20 comprising the first AlN layer (first buffer layer) 21 having a thickness of approximately 40 nm, the GaN layer (intermediate layer) 22 having a thickness of approximately 0.3 μm, the second AlN layer (second buffer layer) 23 having a thickness of approximately 40 nm, and the GaN layer 31 having a thickness of approximately 2 μm.

Generally, a buffer layer is amorphous and an intermediate layer is monocrystalline. Repetitions of a buffer layer and an intermediate layer may be formed, and the number of repetitions is not particularly limited. The greater the number of repetitions, the greater the improvement in crystallinity.

Figure 6A:
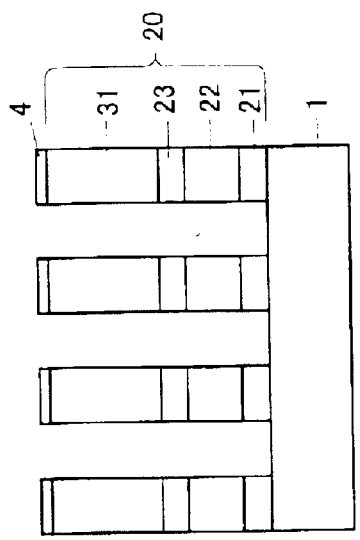
FIG. 6 is a series of sectional views showing the steps of fabricating a Group III nitride compound semiconductor according to sixth to ninth embodiments of the present invention.

Next, by forming a layer comprising tungsten (W) and patterning it by use of wet etching in a striped pattern, a mask 4 was formed. Next, by use of the tungsten (W) mask 4, stripe-shaped trenches of the underlying layer of the GaN 31 each having a width of 1 μm were selectively dry-etched at intervals of 1 μm by reactive ion beam etching (RIBE) with exposing the substrate 1. As a result, posts of the underlying layer 20 each having a width of 1 μm and a height of 2.3 μm and trenches each having a width of 1 μm were alternatingly formed (FIG. 6A). At this time, the {11–20} planes of the GaN layer 31 were caused to serve as the sidewalls of the trenches of a depth of 2 μm.

Next, while the temperature of the sapphire substrate 1 was maintained at 1150° C., H$_2$ (20 L/min), NH$_3$ (10 L/min), and TMG (5 μmol/min) were introduced to there form a GaN layer 32 (similar to that discussed earlier for FIGS. 1A through 1E) through lateral epitaxial growth performed while the sidewalls of the trenches of a depth of 2 μm; i.e., the {11–20} planes of the GaN layer 31, serve as nuclei. At this time, epitaxial growth partially took place from the top surface of the substrate 1 and side surface of the underlying layer 20. Lateral epitaxial growth was performed while the {11–20} planes of the GaN layer 31 primarily served as the growth fronts, thereby filling the trenches and thus establishing a flat top surface. Subsequently, H$_2$ (20 L/min), NH$_3$ (10 L/min), and TMG (300 μmol/min) were introduced to thereby grow the GaN layer 32 such that the total thickness of the GaN layer 31 and the GaN layer 32 becomes 3 μm. In contrast to portions of the GaN layer of the posts, portions of the GaN layer 32 formed above the bottoms of the trenches extending as deep as 2 μm through the GaN layer 31 exhibited significant suppression of threading dislocation.

Figure 7:
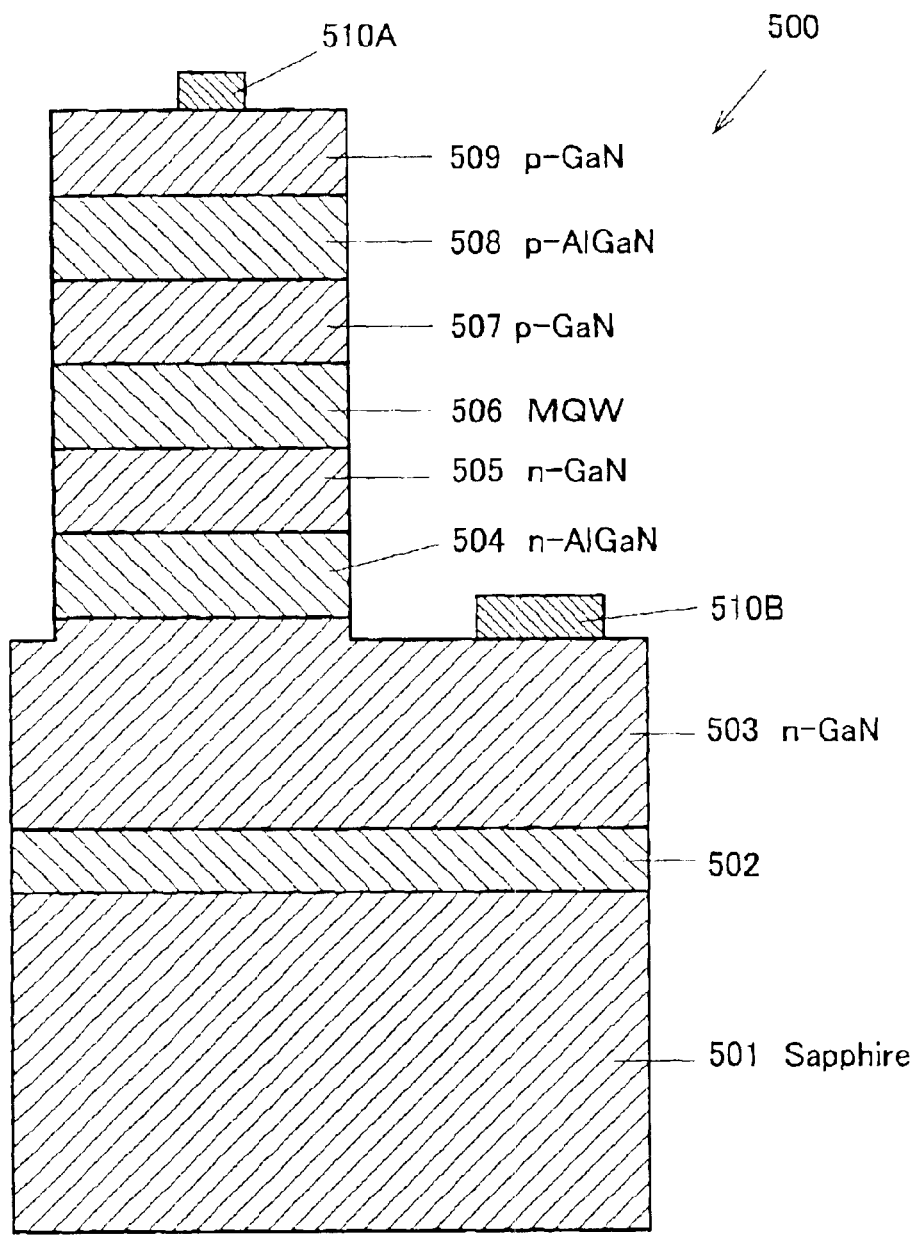
FIG. 7 is a sectional view showing the structure of a Group III nitride compound semiconductor light-emitting device according to sixth to ninth embodiments of the present invention.

On a wafer formed in the above described manner, a laser diode (LD) 500 shown in FIG. 7 was formed in the following manner. Notably, in formation of the GaN layer 32, silane (SiH$_4$) was introduced so as to form a silicon (Si)-doped n-type GaN layer serving as the GaN layer 32. For the sake of simplified illustration, the drawing merely illustrates a GaN layer 503 to inclusively represent the n-type GaN layer 32 formed on upper side of the mask 4. The underlying layer 502 inclusively represents the underlying layer 20 etched in a stripe pattern, the mask 4, and the n-type GaN layer 32 which fills the trenches.

On a wafer comprising a sapphire substrate 501, the underlying layer 502 etched in a stripe pattern, and the GaN layer 503, an n-clad layer 504 of silicon (Si)-doped Al$_{0.08}$Ga$_{0.92}$N, an n-guide layer 505 of silicon (Si)-doped GaN, an emission layer 506 having a MQW structure, a p-guide layer 507 of magnesium (Mg)-doped GaN, a p-clad layer 508 of magnesium (Mg)-doped Al$_{0.08}$Ga$_{0.92}$N, and a p-contact layer 509 of magnesium (Mg)-doped GaN were formed. Next, an electrode 510A of gold (Au) was formed on the p-contact layer 509. Etching was partially performed until the two-layered GaN layer 503 consisting of the GaN layer and the n-type GaN layer was exposed. On the exposed GaN layer 503, an electrode 510B of aluminum (Al) was formed. The thus-formed laser diode (LD) exhibited the improvement of device life time and light-emitting efficiency.

Seventh Embodiment

Figure 6C:
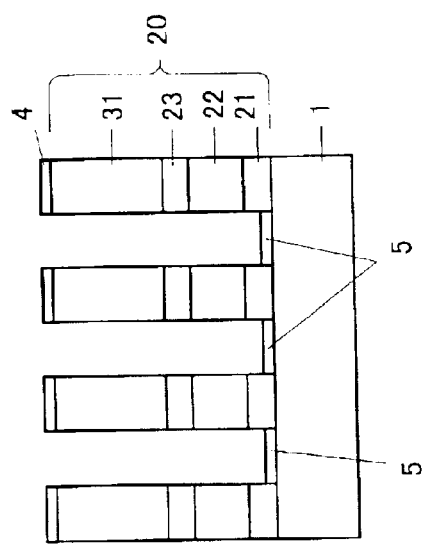
Figure 6B:
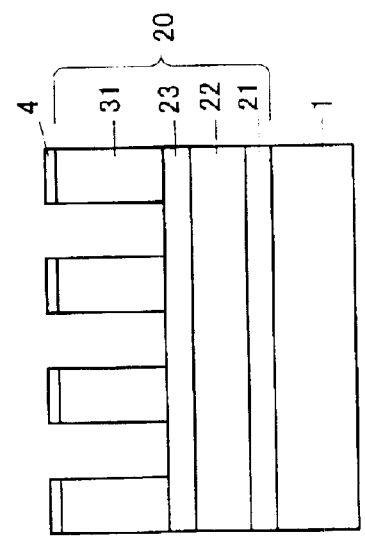

FIG. 6B illustrates the present embodiment. As in the sixth embodiment, a first AlN layer (first buffer layer) 21 having a thickness of approximately 40 nm, a GaN layer (intermediate layer) 22 having a thickness of approximately 0.3 μm, a second AlN layer (second buffer layer) 23 having a thickness of approximately 40 nm, and a GaN layer 31 having a thickness of approximately 2 μm was formed on a single-crystal sapphire substrate 1. Subsequently, forming a mask 4 of tungsten (W), etching was carried out so that a portion of the second AlN layer (second buffer layer) 23 remains. Then, as in the sixth embodiment, the GaN 32 was grown by lateral epitaxial growth and thereby obtaining a wafer. By using this wafer, a laser diode (LD) was formed similarly to the laser diode (LD) 500 in the sixth embodiment shown in FIG. 7. Characteristic of the LD in the present invention is approximately the same as that of the LD in the sixth embodiment.

Eighth Embodiment

FIG. 6C illustrates the present embodiment. As in the sixth embodiment, a first AlN layer (first buffer layer) 21 having a thickness of approximately 40 nm, a GaN layer (intermediate layer) 22 having a thickness of approximately 0.3 μm, a second AlN layer (second buffer layer) 23 having a thickness of approximately 40 nm, and a GaN layer 31 having a thickness of approximately 2 μm was formed on a single-crystal sapphire substrate 1. Subsequently, etching was carried out so that the substrate 1 exposes. Next, a mask 5 of tungsten (W) was formed on the exposed surface of the substrate 1. Then, as in the sixth embodiment, the GaN 32 was grown by lateral epitaxial growth and thereby obtaining a wafer. By using this wafer, a laser diode (LD) was formed similarly to the laser diode (LD) 500 in the sixth embodiment shown in FIG. 7. Characteristic of the LD in the present invention is approximately the same as that of the LD in the sixth embodiment.

Ninth Embodiment

Figure 6D:
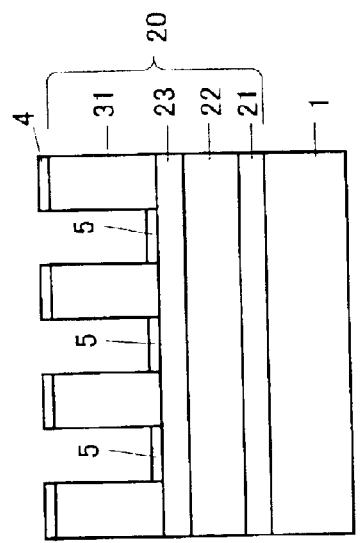

FIG. 6D illustrates the present embodiment. As in the sixth embodiment, a first AlN layer (first buffer layer) 21 having a thickness of approximately 40 nm, a GaN layer (intermediate layer) 22 having a thickness of approximately 0.3 μm, a second AlN layer (second buffer layer) 23 having a thickness of approximately 40 nm, and a GaN layer 31 having a thickness of approximately 2 μm was formed on a single-crystal sapphire substrate 1. Subsequently, forming a mask 4 of tungsten (W), etching was carried out so that the second AlN layer (second buffer layer 23) remains. Next, a mask 5 of tungsten (W) was formed on the exposed surface of the second AlN layer (second buffer layer) 23. Then, as in the sixth embodiment, the GaN 32 was grown by lateral epitaxial growth and thereby obtaining a wafer. By using this wafer, a laser diode (LD) was formed similarly to the laser diode (LD) 500 in the sixth embodiment shown in FIG. 7. Characteristic of the LD in the present invention is approximately the same as that of the LD in the sixth embodiment.

Tenth Embodiment

Figure 8:
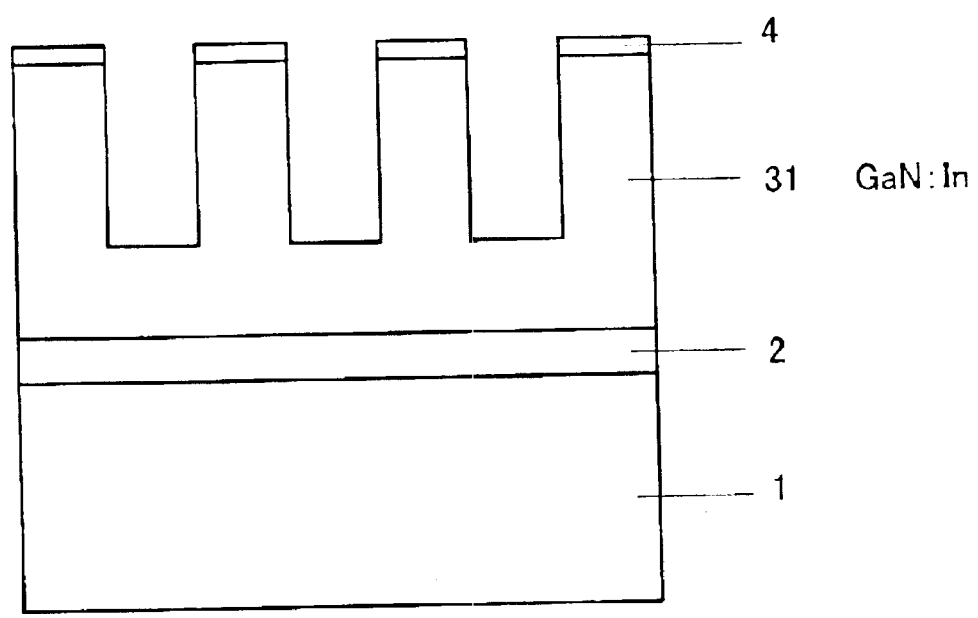
FIG. 8 is a sectional view showing the step of fabricating the Group III nitride compound semiconductor according to a tenth embodiment of the present invention.
Figure 9:
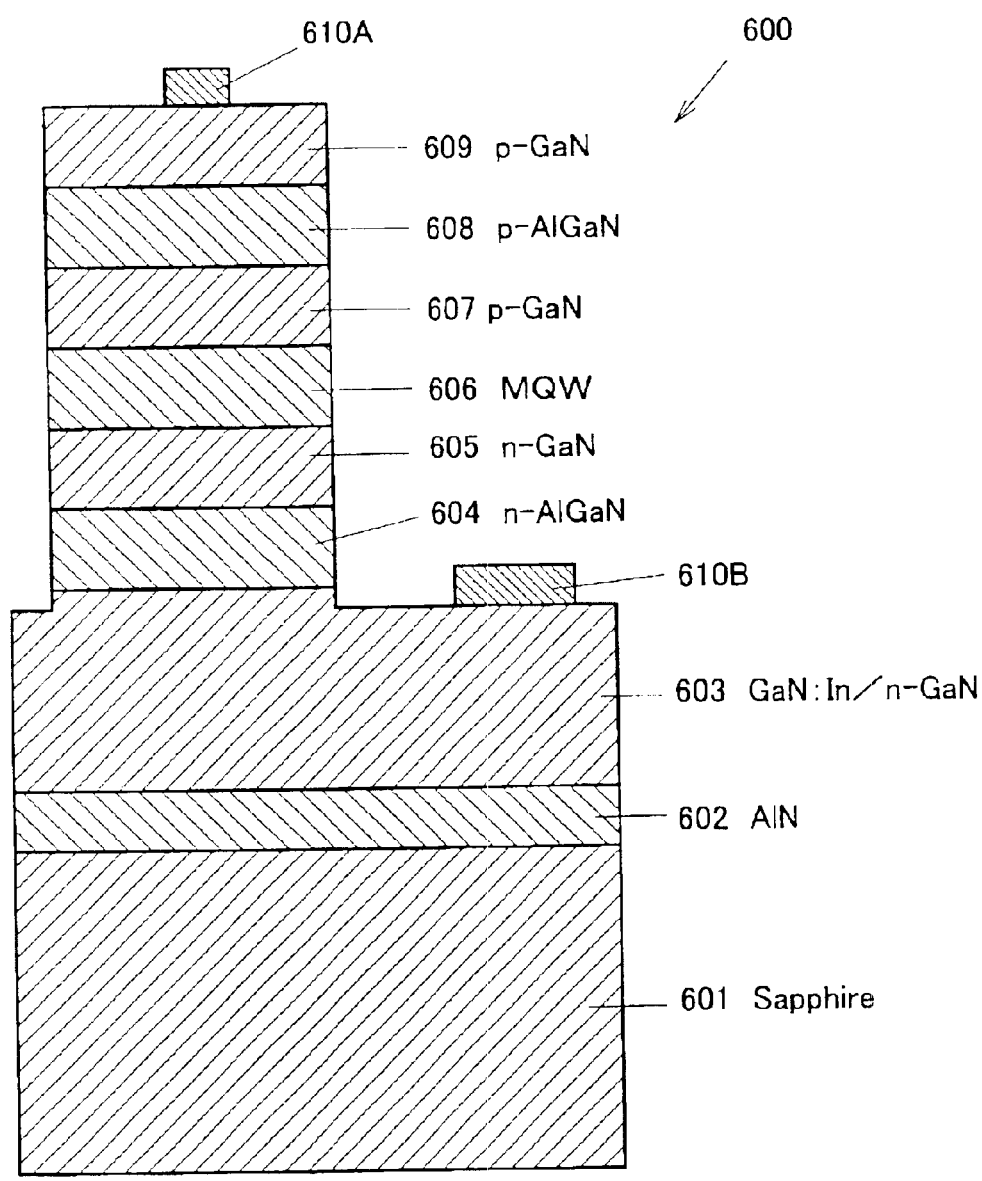
FIG. 9 is a sectional view showing the structure of a Group III nitride compound semiconductor light-emitting device according to the tenth embodiment of the present invention.
Figure 11:
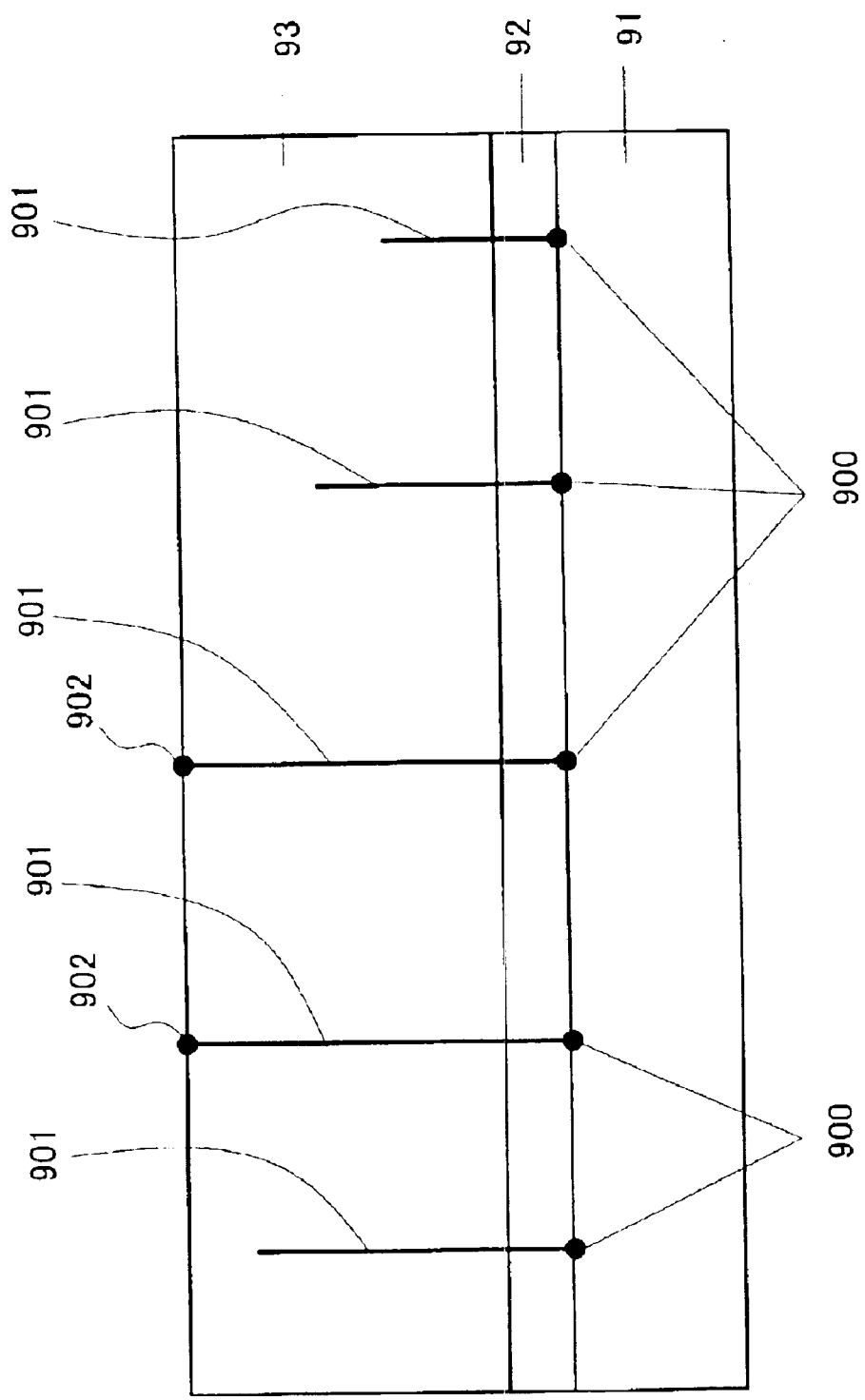
FIG. 11 is a sectional view showing threading dislocations propagating in a Group III nitride compound semiconductor fabricated.

In the present embodiment, as shown in FIG. 8A, indium (In)-doped gallium nitride (GaN:In) layer is used as a first group III nitride compound semiconductor in the wafer of the first embodiment (FIG. 1). Doping concentration of the indium (In) is approximately $1 \times 10^{16}/cm^3$. Then the silicon (Si)-doped GaN was grown by lateral epitaxial growth, a wafer was obtained by carrying out similar process to that of the first embodiment. Accordingly a laser diode (LD) 600 shown in FIG. 9 was formed. Characteristic of the LD in the present invention is approximately the same as that of the LD 600 in the sixth embodiment.

Alternatively, indium (In) may be doped in the underlying layer in all the embodiments in order to improve crystallinity of the underlying layer. Improving crystallinity of the underlying layer results in further improving crystallinity of a layer growing thereon by lateral growth.

Modification of Etching

FIG. 10 shows an example in which island-like posts are formed by means of three groups of {11–20} planes. To facilitate understanding, the schematic view of FIG. 10A includes a peripheral region formed by means of three groups of {11–20} planes. In actuality, tens of millions of island-like posts may be formed per wafer. In FIG. 10A, the area of the bottoms of the trenches B is 3 times the area of the top surfaces of the island-like posts. In FIG. 10B, the area of the bottoms of the trenches B is 8 times the area of the top surfaces of the island-like posts.

Obviously, numerous modifications and variations of the present invention are possible in light of the above teachings. It is therefore to be understood that within the scope of the appended claims, the present invention may be practiced otherwise than as specifically described herein.

What is claimed is:

1. A method for fabricating a Group III nitride compound semiconductor through epitaxial growth, comprising:

using a mask;

etching an underlying layer comprising at least one layer of a Group III nitride compound semiconductor, the uppermost layer of said underlying layer being formed of a first Group III nitride compound semiconductor, to thereby form an island-like structure being one of a dot-like, stripe-shaped, or grid-like structure; and epitaxially growing, vertically and laterally, a second Group III nitride compound semiconductor not grown on said mask epitaxially, with said mask remaining on the upper surface of the uppermost layer in said underlying layer of a trench and with a sidewall of a trench serving as a nucleus for epitaxial growth, a post and said trench being formed by etching said first Group III nitride compound semiconductor so as to form an island-like structure being one of a dot-like, stripe-shaped,or grid-like structure, wherein said underlying layer comprises plural units of a buffer layer formed on a substrate and said second Group III nitride compound semiconductor layer epitaxially grown thereon.

2. A method for fabricating a Group III nitride compound semiconductor according to claim 1, wherein said underlying layer is formed on said substrate and said etching is carried out until said substrate is exposed.

3. A method for fabricating a Group III nitride compound semiconductor according to claim 1, wherein the depth and the width of said trench are determined such that lateral growth from the sidewall/sidewalls for covering said trench proceeds faster than vertical growth from the bottom portion of said trench for burying said trench.

4. A method for fabricating a Group III nitride compound semiconductor according to claim 1, wherein substantially all the sidewalls of said trench are a {11–20} plane.

5. A method for fabricating a Group III nitride compound semiconductor according to claim 1, wherein said first Group III nitride compound semiconductor and said second Group III nitride compound semiconductor have the same composition.

6. A method for fabricating a Group III nitride compound semiconductor according to claim 1, wherein compositions and a temperature for forming said buffer layer are different from those of said Group III nitride compound semiconductor layer formed adjacent to said buffer layer.

7. A method for fabricating a Group III nitride compound semiconductor according to claim 1, wherein compositions and a temperature for forming said buffer layer are different from those of said Group III nitride compound semiconductor layer formed adjacent to said buffer layer.

8. A method for fabricating a Group III nitride compound semiconductor according to claim 1, wherein a portion of the compositions in said first Group III nitride compound semiconductor layer is substituted for or doped with elements whose atomic radius is larger than that of predominant elements of said Group III nitride compound semiconductor layer.

9. A method for fabricating a Group III nitride compound semiconductor according to claim 1, further comprising forming a second mask in order to cover the bottom surface of said trench before growing said second Group III nitride compound semiconductor layer epitaxially.

10. A Group III nitride compound semiconductor device comprising:
a single Group III nitride compound semiconductor layer or plural Group III nitride compound semiconductor layers functioning as a semiconductor device, form on a portion of a Group III nitride compound semiconductor layer, provided through lateral epitaxial growth, produced through a method for fabricating a Group III nitride compound semiconductor as recited in connection with claim 1.

11. A method for fabricating a Group III nitride compound semiconductor according to claim 1, further comprising removing substantially entire portions except for an upper layer formed on a portion provided through late epitaxial growth, to thereby obtain a Group III nitride compound semiconductor layer.

12. A method for fabricating a Group III nitride compound semiconductor through epitaxial growth, comprising:

using a mask;

etching an underlying layer comprising at least one layer of a Group III nitride compound semiconductor, the uppermost layer of said underlying layer being formed of a first Group III nitride compound semiconductor, to thereby form an island-like structure being one of a dot-like, stripe-shaped, or grid-like structure; and epitaxially growing, vertically and laterally, a second Group III nitride compound semiconductor not grown on said mask epitaxially, with said mask remaining on the upper surface of the uppermost layer in said underlying layer of a trench and with a sidewall of a trench serving as a nucleus for epitaxial growth, a post and said trench being formed by etching said first Group III nitride compound semiconductor so as to form an island-like structure being one of a dot-like, stripe-shaped, or grid-like structure, wherein a portion of the compositions in said first Group III nitride compound semiconductor layer is substituted for or doped with elements whose atomic radius is larger than that of predominant elements of said first Group III nitride compound semiconductor layer and wherein said underlying layer comprises plural units of said buffer layer formed on a substrate and a said second Group III nitride compound semiconductor layer epitaxially grown thereon.

13. A method for fabricating a Group III nitride compound semiconductor according to claim 12, wherein compositions and a temperature or forming said buffer layer are different from those of said Group III nitride compound semiconductor layer formed adjacent to said buffer layer.

* * * * *

UNITED STATES PATENT AND TRADEMARK OFFICE
CERTIFICATE OF CORRECTION

PATENT NO. : 6,830,948 B2
DATED : December 14, 2004
INVENTOR(S) : Masayoshi Koike et al.

It is certified that error appears in the above-identified patent and that said Letters Patent is hereby corrected as shown below:

<u>Column 17,</u>
Lines 21-30, please correct claim 10 to read:
10. A Group III nitride compound semiconductor device comprising:
a single Group III nitride compound semiconductor layer or plural Group III nitride compound semiconductor layers functioning as a semiconductor device, formed on a portion of a Group III nitride compound semiconductor layer, provided through lateral epitaxial growth, produced through a method for fabricating a Group III nitride compound semiconductor as recited in connection with claim 1.

Signed and Sealed this

Nineteenth Day of April, 2005

JON W. DUDAS
*Director of the United States Patent and Trademark Office*